US012568595B2

(12) United States Patent
Kim et al.

(10) Patent No.: US 12,568,595 B2
(45) Date of Patent: Mar. 3, 2026

(54) GLASS ARTICLE AND DISPLAY DEVICE INCLUDING THE SAME

(71) Applicant: Samsung Display Co., LTD., Yongin-si (KR)

(72) Inventors: Seung Ho Kim, Yongin-si (KR); Jae Gil Lee, Yongin-si (KR); Seung Kim, Yongin-si (KR); Cheol Min Park, Yongin-si (KR); Gyu In Shim, Yongin-si (KR); Jin Won Jang, Yongin-si (KR); So Mi Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 199 days.

(21) Appl. No.: 18/439,721

(22) Filed: Feb. 12, 2024

(65) Prior Publication Data

US 2025/0008676 A1 Jan. 2, 2025

(30) Foreign Application Priority Data

Jun. 29, 2023 (KR) ........................ 10-2023-0083893

(51) Int. Cl.
*H05K 5/03* (2006.01)
*C03C 3/083* (2006.01)
(52) U.S. Cl.
CPC ............... *H05K 5/03* (2013.01); *C03C 3/083* (2013.01)
(58) Field of Classification Search
CPC .......... C03C 21/002; C03C 3/083; H05K 5/03
See application file for complete search history.

(56) References Cited

FOREIGN PATENT DOCUMENTS

| | | | |
|---|---|---|---|
| JP | 5947364 | B2 | 6/2016 |
| JP | 2020097506 | A | 6/2020 |
| KR | 1020210122313 | A | 10/2021 |
| WO | 2014139147 | A1 | 9/2014 |
| WO | 2015195465 | A1 | 12/2015 |
| WO | 2020138062 | A1 | 7/2020 |

*Primary Examiner* — Lawrence D Ferguson
(74) *Attorney, Agent, or Firm* — CANTOR COLBURN LLP

(57) ABSTRACT

A glass article includes a first surface and a second surface opposite to the first surface in a thickness direction. A thickness from the first surface to the second surface ranges from about 20 micrometers (μm) to about 100 μm. A first brittleness index defined by following Equation 1 is about $1.5*10^{-4}$ $\mu m^{0.5}$ or more:

$$\text{First brittleness index} = 1/B = K_{IC}/H_v(\mu m^{0.5}) \quad \text{[Equation 1]}$$

where 'B' is brittleness, '$K_{IC}$' is fracture toughness, and '$H_v$' is hardness, and
a stretch index defined by following Equation (2) is about 0.95 or more:

$$\beta_{KWW} = 1 - \sqrt{\frac{(T_0 - T_g)^2}{D}} \quad \text{[Equation (2)]}$$

where 'D' is a strength factor ($=B_{VFT}/T_0$), '$T_0$' is a Vogel temperature, and '$T_g$' is a glass transition temperature.

20 Claims, 9 Drawing Sheets

GLASS ARTICLE AND DISPLAY DEVICE INCLUDING THE SAME

This application claims priority to Korean Patent Application No. 10-2023-0083893, filed on Jun. 29, 2023, and all the benefits accruing therefrom under 35 U.S.C. § 119, the content of which in its entirety is herein incorporated by reference.

BACKGROUND

1. Field

The disclosure relates to a glass article and a display device including the same.

2. Description of the Related Art

Glass articles are widely used in electronic devices or construction materials including display devices. For example, the glass articles are applied to a substrate of a flat panel display device such as a liquid crystal display device ("LCD"), an organic light-emitting display device ("OLED"), or an electrophoretic display device, or a cover window protecting the same.

As portable electronic devices such as smartphones and tablet personal computers (PCs) become popular, glass articles applied to them are frequently exposed to external impacts. Accordingly, it is desired to develop a glass article which is thin for portability and may withstand external impacts.

In recent years, a foldable display device is being researched for user convenience. It is preferable that a glass article applied to the foldable display device has a thin thickness to alleviate bending stress caused when folded and strength to withstand external impacts. Accordingly, attempts are being made to improve the strength of thin glass articles by changing the composition ratio of the compositions of the glass articles and the manufacturing process conditions.

SUMMARY

Features of the disclosure provide a glass article whose indices defined as predetermined physical properties satisfy a predetermined value to have excellent impact resistance characteristics and a display device including the glass article.

However, features of the disclosure are not restricted to the one set forth herein. The above and other features of the disclosure will become more apparent to one of ordinary skill in the art to which the disclosure pertains by referencing the detailed description of the disclosure given below.

The glass article in an embodiment may have a fracture energy index, an elastic energy index, and a free volume index higher than or equal to a predetermined value, and thus has excellent impact resistance characteristics. A display device including the glass article may have excellent flexibility and strength due to the foldable characteristics of the glass article.

However, effects in the embodiments of the disclosure are not limited to those exemplified above and various other effects are incorporated herein.

In an embodiment of the disclosure, a glass article has a thickness which ranges from about 20 micrometers (μm) to about 100 μm, and a first brittleness index of the glass article defined by following Equation 1 (hereinafter also referred to as Eq. 1) is about $1.5*10^{-4}$ $\mu m^{0.5}$ or more:

$$\text{First brittleness index} = 1/B = K_{IC}/H_v(\mu m^{0.5}) \qquad \text{[Eq. 1]}$$

where 'B' is brittleness, '$K_{IC}$' is fracture toughness, and '$H_v$' is hardness, and a stretch index defined by following Equation (2) (hereinafter also referred to as Eq. (2)) is about 0.95 or more:

$$\beta_{KWW} = 1 - \sqrt{\frac{(T_0 - T_g)^2}{D}} \qquad \text{[Eq. (2)]}$$

where 'D' is a strength factor (=$B_{VFT}/T_0$), '$T_0$' is a Vogel temperature, and '$T_g$' is a glass transition temperature.

In an embodiment, a second brittleness index defined by following Equation 2 (hereinafter also referred to as Eq. 2) may be about $2.3*10^{-10}$ MPa*m or more:

$$\text{Second brittleness index} = 1/B * K_{IC}(\text{MPa}*\text{m}) \qquad \text{[Eq. 2]}$$

where 'B' is brittleness, and '$K_{IC}$' is fracture toughness.

In an embodiment, a third brittleness index defined by following Equation 3 (hereinafter also referred to as Eq. 3) may be about $2.0*10^{-7}$ $\mu m^{0.5}/K$:

$$\text{Third brittleness index} = 1/B * 1/T_g(\mu m^{0.5}/K) \qquad \text{[Eq. 3]}$$

where 'B' is brittleness, and '$T_g$' is the glass transition temperature.

In an embodiment, a fourth brittleness index defined by following Equation 4 (hereinafter also referred to as Eq. 4) may be about $1.6*10^{-2}$ MPa*$\mu m^{0.5}/K$ or more:

$$\text{Fourth brittleness index} = 1/B * 1/T_g * E(\text{MPa}*\mu m^{0.5}/K) \qquad \text{[Eq. 4]}$$

where 'B' is brittleness, '$T_g$' is the glass transition temperature, and 'E' is Young's modulus.

In an embodiment, in a pen drop test performed with a pen having a ball diameter of about 0.7 millimeters (mm) and a weight of about 1.12 g, a crack occurrence height may be about 6 cm or more.

In an embodiment, the glass article may have flexibility.

In an embodiment, a glass transition temperature may be equal to or lower than 600° C.

In an embodiment, the glass article may include or consist of $SiO_2$, $Al_2O_3$, and metal oxide, fluxes defined as a ratio of a content of a monovalent metal oxide to a content of a divalent metal oxide in the metal oxide may be within a range of 5 to 10, and a ratio of a content of $Al_2O_3$ to a total content of the metal oxide may be within a range of 0.2 to 0.6.

In an embodiment of the disclosure, a glass article for a cover window of a foldable display device has a thickness which ranges from about 20 μm to about 100 μm, and a first brittleness index of the glass article defined by following Eq. 1 is about $1.5*10^{-4}$ $\mu m^{0.5}$ or more:

3                                                      4

$$\text{First brittleness index} = 1/B = K_{IC}/H_v(\mu m^{0.5}) \qquad \text{[Eq. 1]}$$

where 'B' is brittleness, '$K_{IC}$' is fracture toughness, and
'$H_v$' is hardness, in a pen drop test performed with a pen
having a ball diameter of about 0.7 mm and a weight of
about 1.12 g, a crack occurrence height is about 6 cm
or more, and the glass article has flexibility.

In an embodiment of the disclosure, a display device
comprises a display panel comprising a plurality of pixels,
a cover window disposed above the display panel, and an
optically transparent bonding layer disposed between the
display panel and the cover window, wherein the cover
window comprises a glass article having a thickness ranges
from about 20 μm to about 100 μm, having a first brittleness
index defined by following Eq. 1 is about $1.5*10^{-4}$ $\mu m^{0.5}$ or
more:

$$\text{First brittleness index} = 1/B = K_{IC}/H_v(\mu m^{0.5}) \qquad \text{[Eq. 1]}$$

where 'B' is brittleness, '$K_{IC}$' is fracture toughness, and
'$H_v$' is hardness, and having a stretch index defined by
following Eq. (2) is 0.95 or more:

$$\beta_{KWW} = 1 - \sqrt{\frac{(T_0 - T_g)^2}{D}} \qquad \text{[Eq. (2)]}$$

where 'D' is a strength factor (=$B_{VFT}/T_0$), '$T_0$' is a Vogel
temperature, and '$T_g$' is a glass transition temperature.

BRIEF DESCRIPTION OF THE DRAWINGS

The above and other embodiments and features of the
disclosure will become more apparent by describing in detail
embodiments thereof with reference to the attached draw-
ings, in which.

DETAILED DESCRIPTION

Embodiments of the disclosure will now be described
more fully hereinafter with reference to the accompanying drawings, in which preferred embodiments of the invention
are shown. This invention may, however, be embodied in
different forms and should not be construed as limited to the
embodiments set forth herein. Rather, these embodiments
are provided so that this disclosure will be thorough and
complete, and will fully convey the scope of the invention
to those skilled in the art.

It will also be understood that when a layer is referred to
as being "on" another layer or substrate, it can be directly on
the other layer or substrate, or intervening layers may also
be present. The same reference numbers indicate the same
components throughout the specification.

It will be understood that, although the terms "first,"
"second," etc. may be used herein to describe various
elements, these elements should not be limited by these
terms. These terms are only used to distinguish one element
from another element. For instance, a first element discussed
below could be termed a second element without departing
from the teachings of the invention. Similarly, the second
element could also be termed the first element.

"About" or "approximately" as used herein is inclusive of
the stated value and means within an acceptable range of
deviation for the particular value as determined by one of
ordinary skill in the art, considering the measurement in
question and the error associated with measurement of the
particular quantity (i.e., the limitations of the measurement
system). The term "about" can mean within one or more
standard deviations, or within +30%, 20%, 10%, 5% of the
stated value, for example.

Hereinafter, embodiments will be described with refer-
ence to the accompanying drawings.

Figure 1:
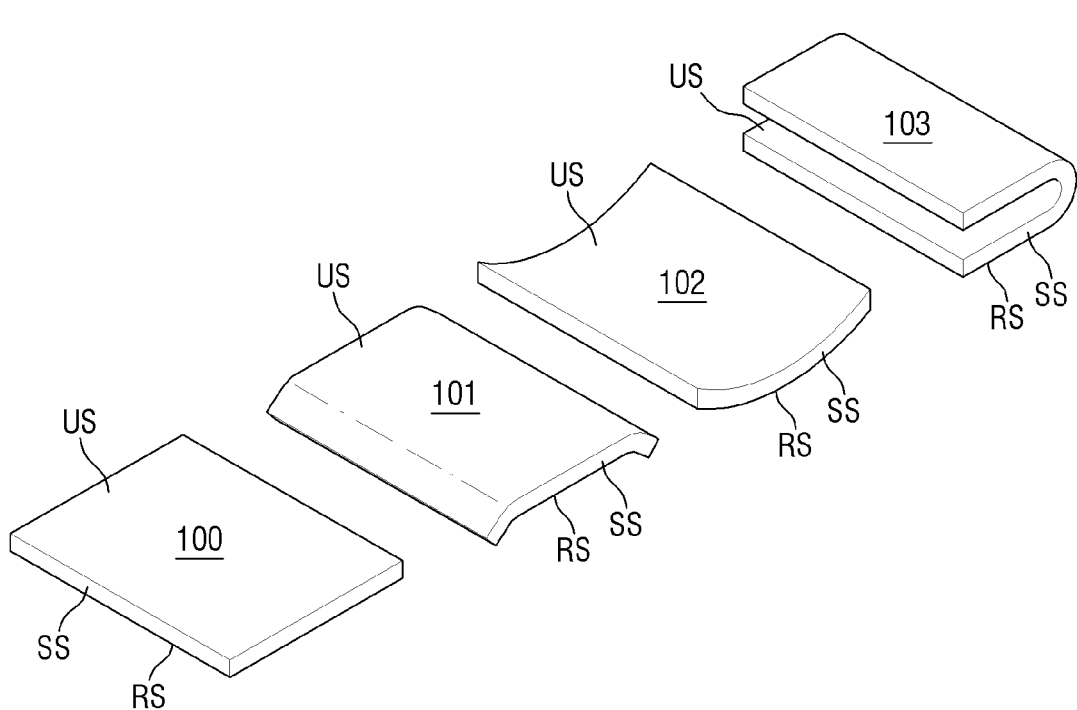
FIG. 1 is a perspective view of an embodiment of a glass
article.

FIG. 1 is a perspective view of an embodiment of a glass
article.

Glass is used as a cover window for protecting a display,
a substrate for a display panel, a substrate for a touch panel,
an optical member such as a light guide plate or the like in
electronic devices including a display, such as a tablet
personal computer ("PC"), a notebook PC, a smartphone, an
electronic book, a television and a PC monitor as well as a
refrigerator and a cleaning machine including a display
screen. Glass may also be employed as a cover glass for a
dashboard of a vehicle, a cover glass for solar cells, interior
materials for construction materials, windows for buildings
and houses, or the like.

Glass is desired to have relatively high strength. In an
embodiment, when glass is employed as a window, it is
desirable to have a relatively small thickness to meet the
desired conditions of relatively high transmittance and light-
weight, and also have strength such that it is not easily
broken by an external impact, for example. Strengthened
glass may be produced by, e.g., chemical strengthening or
thermal strengthening. In embodiments, strengthened glass
having various shapes are shown in FIG. 1.

Referring to FIG. 1, in an embodiment, a glass article 100
may have a flat sheet shape or a flat plate shape. In another
embodiment, glass articles 101, 102 and 103 may have a
three-dimensional shape including bent portions. In an
embodiment, the edges of the flat portion may be bent (e.g.,
the glass article 101), or the flat portion may be entirely
curved (e.g., the glass article 102) or folded (e.g., the glass
article 103), for example. In an alternative embodiment, the
glass article 100 may have a flat sheet shape or a flat plate
shape, and may be flexibly folded, stretched, or rolled.

The planar shape of the glass articles 100 to 103 may be
a quadrangular shape, e.g., rectangular shape, but is not
limited thereto, and may have various shapes such as a
rectangular shape with rounded corners, a square shape, a circular shape, and an elliptical shape. In the following embodiment, a flat plate having a quadrangular, e.g., rectangular planar shape is described in an embodiment of the glass articles 100 to 103, but the disclosure is not limited thereto. In an embodiment, the glass articles 100, 101, 102 and 103 may each include a first surface US, a second surface RS and a side surface SS.

Figure 2:
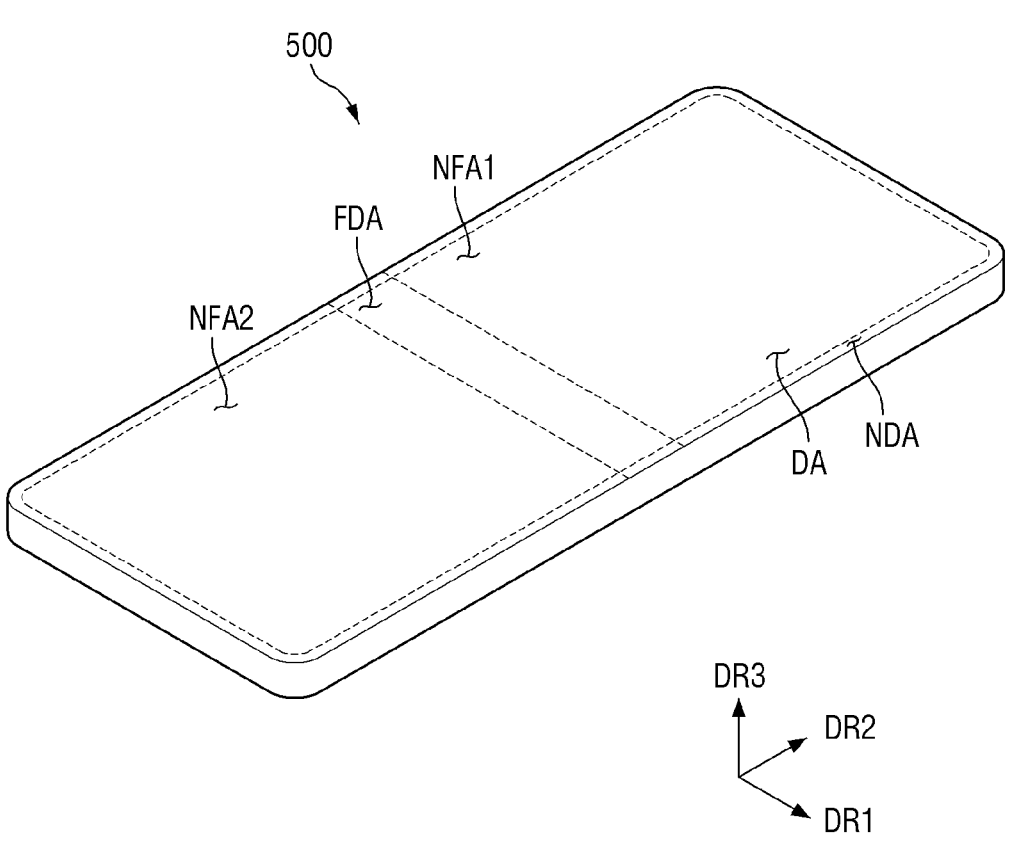
FIG. 2 is a perspective view showing an embodiment of
a display device to which a glass article is applied in an
unfolded state.
Figure 3:
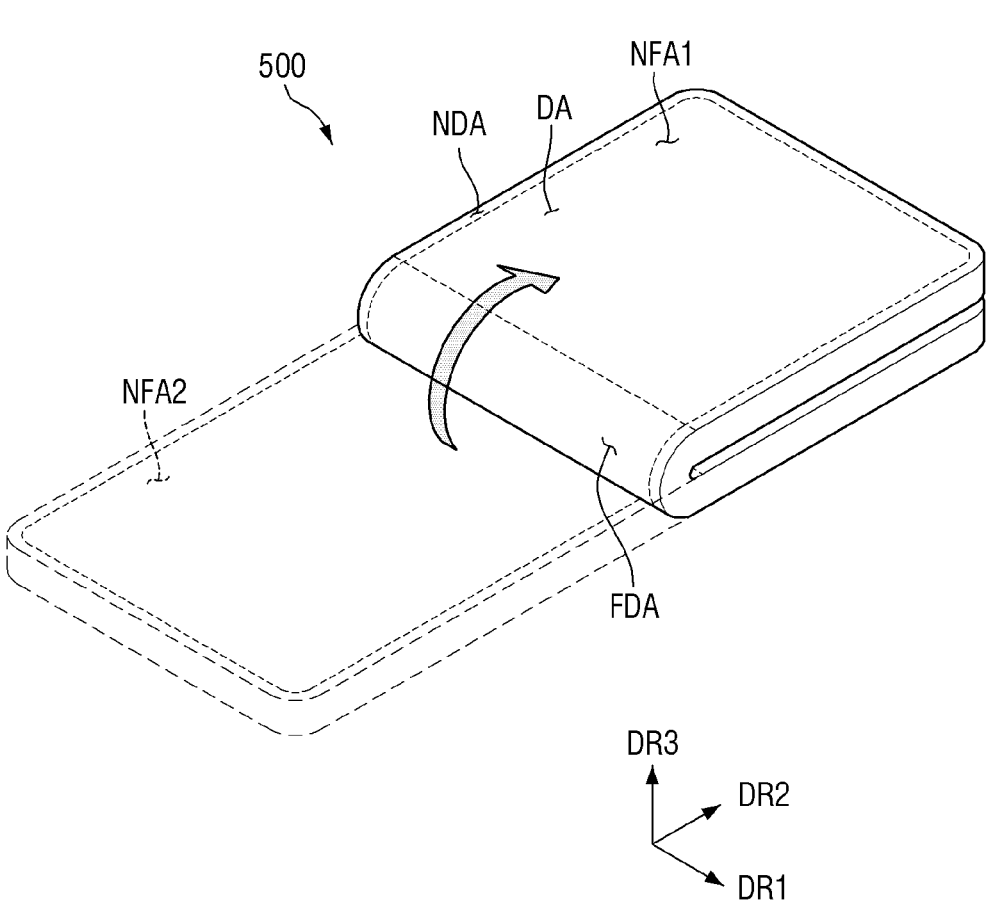
FIG. 3 is a perspective view showing the display device
of FIG. 2 in a folded state.

FIG. 2 is a perspective view showing an embodiment of a display device to which a glass article is applied in an unfolded state. FIG. 3 is a perspective view showing the display device of FIG. 2 in a folded state.

Referring to FIGS. 2 and 3, a display device 500 in an embodiment may be a foldable display device. As will be described later, in the display device 500, the glass article 100 of FIG. 1 may be applied to a cover window, and the glass article 100 may be flexible and foldable.

In FIGS. 2 and 3, a first direction DR1 may be a direction parallel to one side of the display device 500 in a plan view and may be, e.g., a horizontal direction of the display device 500. A second direction DR2 may be a direction parallel to the other side in contact with one side of the display device 500 in a plan view and may be, e.g., a vertical direction of the display device 500. A third direction DR3 may be a thickness direction of the display device 500.

In an embodiment, the display device 500 may have a quadrangular shape, e.g., rectangular shape in a plan view. The display device 500 may have a rectangular shape with right-angled or rounded corners in a plan view. The display device 500 may include two short sides arranged in the first direction DR1 and two long sides arranged in the second direction DR2 in a plan view.

The display device 500 includes a display area DA and a non-display area NDA. In plan view, the shape of the display area DA may correspond to the shape of the display device 500. In an embodiment, when the display device 500 has a quadrangular shape, e.g., rectangular shape in a plan view, the display area DA may also have a quadrangular shape, e.g., rectangular shape, for example.

The display area DA may be an area including a plurality of pixels to display an image. The plurality of pixels may be arranged in a matrix. The plurality of pixels may have a quadrangular, e.g., rectangular, rhombic, or square shape in a plan view, without being limited thereto. In an embodiment, the plurality of pixels may have a quadrilateral shape other than a rectangular, rhombic, or square shape, a polygonal shape other than a quadrilateral shape, a circular shape, or an elliptical shape, for example.

The non-display area NDA may be an area that does not include pixels and does not display an image. The non-display area NDA may be disposed around the display area DA. The non-display area NDA may be disposed to surround the display area DA, but is not limited thereto. The display area DA may be partially surrounded by the non-display area NDA.

In an embodiment, the display device 500 may maintain both a folded state and an unfolded state. As shown in FIG. 3, the display device 500 may be folded in an in-folding manner in which the display area DA is disposed on the inside thereof. When the display device 500 is folded in an in-folding manner, the top surfaces of the display device 500 may be disposed to face each other. In another embodiment, the display device 500 may be folded in an out-folding manner in which the display area DA is disposed on the outside. When the display device 500 is folded in an out-folding manner, the bottom surfaces of the display device 500 may be disposed to face each other.

In an embodiment, the display device 500 may be a foldable device. As used herein, the term "foldable device" refers to a device which may be folded and is used to mean not only a folded device but also a device that may have both a folded state and an unfolded state. Further, the folding may typically include folding at an angle of about 180 degrees. However, the disclosure is not limited thereto, and it may include a case where the folding angle exceeds about 180 degrees or is less than about 180 degrees, e.g., a case where the folding angle is equal to or greater than about 90 degrees and less than about 180 degrees, or a case where the folding angle is equal to or greater than about 120 degrees and less than about 180 degrees. In addition, it may be also referred to as a folded state when folding is performed out of the unfolded state, even when complete folding is not performed. In an embodiment, even when it is folded at an angle of about 90 degrees or less, as long as the maximum folding angle becomes about 90 degrees or more, it may be expressed as being in a folded state to distinguish it from the unfolded state. During the folding, the radius of curvature may be about 5 millimeter (mm) or less, preferably in the range of about 1 mm to about 2 mm, or about 1.5 mm, but is not limited thereto.

In an embodiment, the display device 500 may include a folding area FDA, a first non-folding area NFA1, and a second non-folding area NFA2. The folding area FDA may be an area in which the display device 500 is folded, and the first and second non-folding areas NFA1 and NFA2 may be areas in which the display device 500 is not folded.

The first non-folding area NFA1 may be disposed on one side (e.g., an upper side) of the folding area FDA. The second non-folding area NFA2 may be disposed on the other side (e.g., a lower side) of the folding area FDA. The folding area FDA may be an area bent at a predetermined curvature.

In an embodiment, the folding area FDA of the display device 500 may be determined at a predetermined location. One or two or more folding areas FDA may be determined at a predetermined location(s) in the display device 500. In another embodiment, the location of the folding area FDA may not be specified in the display device 500 and may be freely set in various areas.

In an embodiment, the display device 500 may be folded in the second direction DR2. Accordingly, the length of the display device 500 in the second direction DR2 may be reduced to approximately half, so that a user may conveniently carry the display device 500.

In an embodiment, the direction in which the display device 500 is folded is not limited to the second direction DR2. In an embodiment, the display device 500 may be folded in the first direction DR1. In this case, the length of the display device 500 in the first direction DR1 may be reduced to approximately half, for example.

It is illustrated in the drawing that each of the display area DA and the non-display area NDA overlaps the folding area FDA, the first non-folding area NFA1, and the second non-folding area NFA2, but the disclosure is not limited thereto. In an embodiment, each of the display area DA and the non-display area NDA may overlap at least one of the folding area FDA, the first non-folding area NFA1, and the second non-folding area NFA2, for example.

Figure 4:
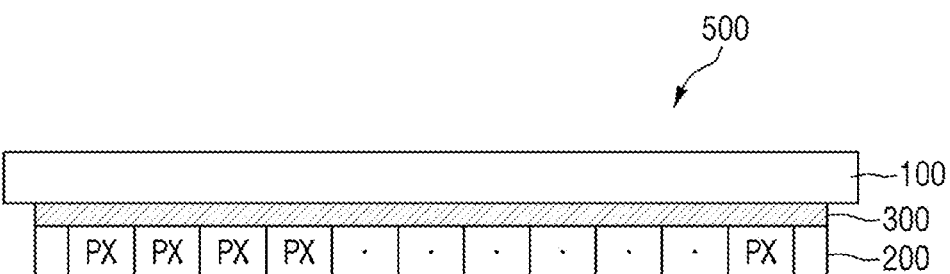
FIG. 4 is a cross-sectional view illustrating an embodi-
ment in which a glass article is applied to a cover window
of a display device.

FIG. 4 is a cross-sectional view illustrating an embodiment in which a glass article is applied to a cover window of a display device.

Referring to FIG. 4, the display device 500 may include a display panel 200, the glass article 100 disposed on the display panel 200 and serving as a cover window, and an optically transparent bonding layer 300 disposed between the display panel 200 and the glass article 100 to bond the display panel 200 and the glass article 100 to each other.

In embodiments, the display panel 200 may include not only a self-light-emitting display panel such as an organic light-emitting display ("OLED") panel, an inorganic electroluminescence ("EL") display panel, a quantum dot light-emitting display ("QED") panel, a micro-LED display panel, a nano-LED display panel, a plasma display panel ("PDP"), a field emission display ("FED") panel and a cathode ray tube ("CRT") display panel, but also a light-receiving display panel such as a liquid crystal display ("LCD") panel and an electrophoretic display ("EPD") panel.

The display panel 200 includes a plurality of pixels PX and may display an image by light emitted from each pixel PX. The display device 500 may further include a touch member (not shown). In an embodiment, the touch member may be embedded in the display panel 200. In an embodiment, since the touch member is directly formed on a display member of the display panel 200, the display panel 200 itself may perform a touch function, for example. In another embodiment, the touch member may be manufactured separately from the display panel 200 and then attached to the top surface of the display panel 200 by an optically transparent bonding layer.

The glass article 100 is disposed above the display panel 200 to protect the display panel 200. Since the glass article 100 is larger in size than the display panel 200, the side surface thereof may protrude outward from the side surface of the display panel 200, but it is not limited thereto. The display device 500 may further include a printed layer (not shown) disposed on at least one surface of the glass article 100 at an edge portion of the glass article 100. The printed layer may prevent the bezel area of the display device 500 from being visible from the outside, and may perform a decoration function in some cases.

The optically transparent bonding layer 300 is disposed between the display panel 200 and the glass article 100. The optically transparent bonding layer 300 serves to fix the glass article 100 onto the display panel 200. The optically transparent bonding layer 300 may include an optically clear adhesive ("OCA"), an optically clear resin ("OCR"), or the like.

Hereinafter, the strengthened glass article 100 will be described in more detail.

Figure 5:
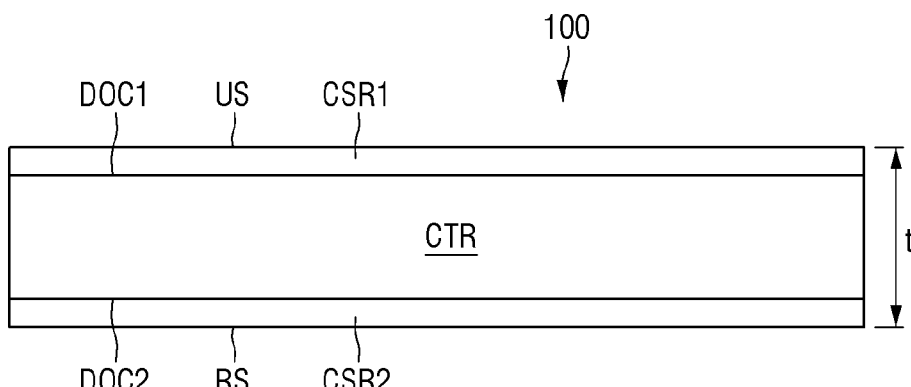
FIG. 5 is a cross-sectional view of an embodiment of a
glass article having a flat plate shape.

FIG. 5 is a cross-sectional view of a glass article having a flat plate shape.

Referring to FIG. 5, the glass article 100 may include a first surface US, a second surface RS and a side surface. In the glass article 100 having a flat plate shape, the first surface US and the second surface RS are main surfaces having a relatively large area, and the side surface is an outer surface connecting the first surface US with the second surface RS.

The first surface US and the second surface RS are opposite to each other in a thickness direction. When the glass article 100 serves to transmit light in the same manner as the cover window of a display, the light may be mainly incident on one of the first surface US and the second surface RS and pass through the other one.

A thickness t of the glass article 100 is defined as a distance between the first surface US and the second surface RS. The thickness t of the glass article 100 is not limited thereto, but may be about 100 micrometers (µm) or less, preferably within a range of about 20 µm to about 100 µm. In an embodiment, the thickness t of the glass article 100 may be about 80 µm or less. In another embodiment, the thickness t of the glass article 100 may be about 75 µm or less. In another embodiment, the thickness t of the glass article 100 may be about 70 µm or less. In another embodiment, the thickness t of the glass article 100 may be about 60 µm or less. In another embodiment, the thickness t of the glass article 100 may be about 65 µm or less. In another embodiment, the thickness t of the glass article 100 may be about 50 µm or less. In another embodiment, the thickness t of the glass article 100 may be about 30 µm or less. In some predetermined examples, the thickness t of the glass article 100 may be within a range of about 20 µm to about 50 µm, or may be about 30 µm. The glass article 100 may have a uniform thickness t, but is not limited thereto and may have a different thickness t for each region.

The glass article 100 may be strengthened to have a predetermined stress profile therein. The strengthened glass article 100 more efficiently prevents generation of cracks, propagation of cracks, breakage or the like due to external impact than the glass article 100 before strengthening. The glass article 100 strengthened by a strengthening process may have a different stress for each region. In an embodiment, compressive regions CSR1 and CSR2 to which a compressive stress is applied may be disposed in the vicinity of the surface of the glass article 100, i.e., near the first surface US and the second surface RS, and a tensile region CTR to which a tensile stress is applied may be disposed inside the glass article 100, for example. Boundaries DOC1 and DOC2 between the compressive regions CSR1 and CSR2 and the tensile region CTR may have a stress value of zero. The compressive stress in one compressive region CSR1 or CSR2 may vary in its stress value depending on the position (i.e. depth from the surface). Also, the tensile region CTR may have a different stress value depending on the depth from the surface US or RS.

The position of the compressive region CSR1 or CSR2, the stress profile in the compressive region CSR1 or CSR2, the compressive energy of the compressive region CSR1 or CSR2, the tensile energy of the tensile region CTR or the like in the glass article 100 may have a substantially great influence on the mechanical properties of the glass article 100 such as the surface strength.

Figure 6:
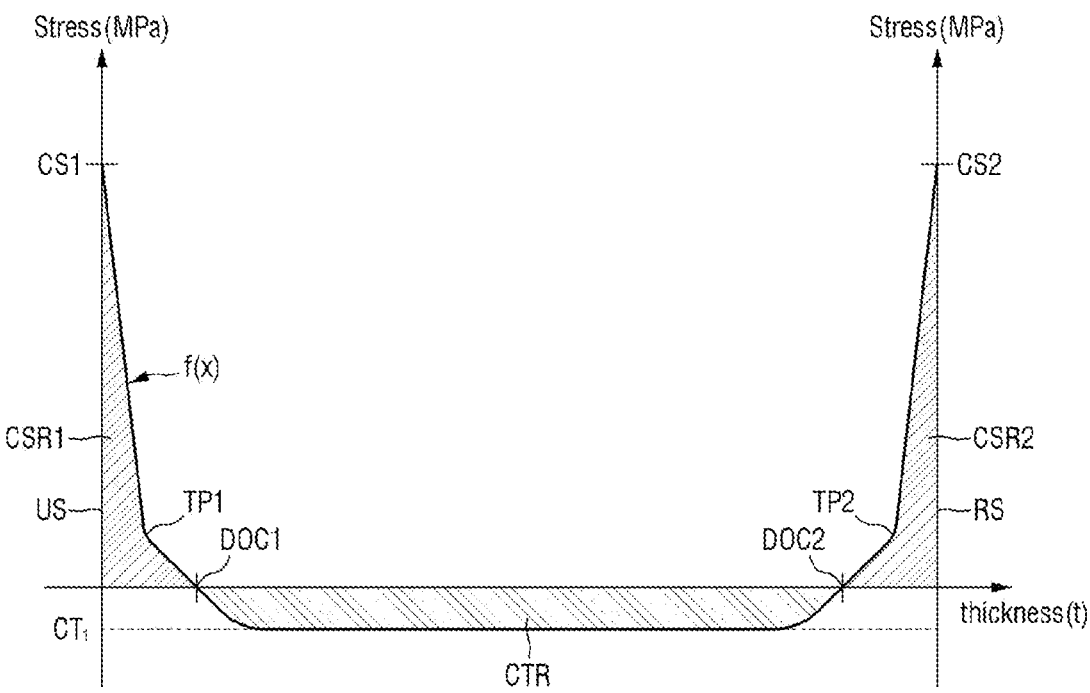
FIG. 6 is a graph showing an embodiment of a stress
profile of a glass article.

FIG. 6 is a graph showing an embodiment of a stress profile of a glass article. In the graph of FIG. 6, an X-axis represents the thickness direction of the glass article. In FIG. 6, the compressive stress has positive values, while the tensile stress has negative values. Herein, the magnitude of the compressive/tensile stress means the magnitude of an absolute value regardless of its sign.

Referring to FIG. 6, the glass article 100 includes a first compressive region CSR1 extending (or expanding) from the first surface US to a first compression depth DOC1, and a second compressive region CSR2 extending (or expanding) from the second surface RS to a second compression depth DOC2. The tensile region CTR is disposed between the first compression depth DOC1 and the second compression depth DOC2. The overall stress profile in the glass article 100 may be symmetrical between both regions of the surfaces US and RS with respect to the center of the direction of the thickness t. Although not shown in FIG. 6, a compressive region and a tensile region may be disposed between opposed side surfaces of the glass article 100 in a similar manner.

The first compressive region CSR1 and the second compressive region CSR2 are resistant to an external impact to prevent the occurrence of cracks or breakage of the glass article 100. As the maximum compressive stresses CS1 and CS2 of the first compressive region CSR1 and the second compressive region CSR2 are larger, the strength of the glass article 100 generally increases. Since an external impact is usually transmitted through the surface of the glass article 100, it is advantageous to have the maximum compressive stresses CS1 and CS2 at the surface of the glass article 100 in terms of durability. From this perspective, the compressive stress of the first compressive region CSR1 and the second compressive region CSR2 tends to be the largest at the surface and generally decrease toward the inside. In an embodiment, the first compressive region CSR1 and the second compressive region CSR2 may respectively include a first transition point TP1 and a second transition point TP2 at which the slope of the stress profile changes abruptly.

The first compression depth DOC1 and the second compression depth DOC2 suppress cracks or grooves defined in the first surface US and the second surface RS from propagating to the tensile region CTR inside the glass article 100. As the first compression depth DOC1 and the second compression depth DOC2 are larger, it is possible to more efficiently prevent propagation of cracks or the like. The point corresponding to the first compression depth DOC1 and the second compression depth DOC2 corresponds to a boundary between the compressive regions CSR1 and CSR2 and the tensile region CTR, and has a stress value of zero.

Throughout the glass article 100, the tensile stress of the tensile region CTR may be balanced with the compressive stress of the compressive regions CSR1 and CSR2. That is, the total compressive stress (i.e., total compressive energy) in the glass article 100 may be the same as the total tensile stress (i.e., total tensile energy) in the glass article 100. The stress energy accumulated in one region having a constant width in the thickness t direction in the glass article 100 may be calculated as an integrated value of the stress profile. The following Equation A may be established when the stress profile in the glass article 100 having a thickness t is represented as a function f(x).

$$\int_0^t f(x)dx = 0 \qquad \text{[Equation A]}$$

The greater the magnitude of the tensile stress in the glass article 100, the more likely the fragments are to be vigorously released when the glass article 100 is broken, and the more likely the glass article 100 is to be broken from the inside. The maximum tensile stress that meets the desired frangibility conditions of the glass article 100 may satisfy, but not limited to, the following Inequality 1.

$$CT_1 \leq -38.7 \times \ln(t) + 48.2 \qquad \text{[Inequality 1]}$$

In some embodiments, the maximum tensile stress $CT_1$ may be about 100 MPa or less, or 85 MPa or less. The maximum tensile stress $CT_1$ of about 75 MPa or more may be desirable to improve mechanical properties such as strength. In an embodiment, the maximum tensile stress $CT_1$ may be greater than or equal to about 75 MPa and less than or equal to about 85 MPa, but is not limited thereto.

The maximum tensile stress $CT_1$ of the glass article 100 may be generally disposed at a central portion in the thickness t direction of the glass article 100. In an embodiment, the maximum tensile stress $CT_1$ of the glass article 100 may be disposed at a depth in the range of about 0.4t to about 0.6t, or in the range of about 0.45t to about 0.55t, or at a depth of about 0.5t.

In order to increase the strength of the glass article 100, it is preferable that the compressive stress and the compression depths DOC1 and DOC2 have relatively large values. However, as the compressive energy increases, the tensile energy also increases, and the maximum tensile stress $CT_1$ may increase. In order to meet the desired fragility conditions while having a relatively high strength, it is desirable to adjust the stress profile such that the maximum compressive stresses CS1 and CS2 and the compression depths DOC1 and DOC2 have relatively large values while the compressive energy becomes smaller. To this end, the glass article 100 may be manufactured by a glass composition including or consisting of predetermined components at a predetermined content. Depending on the composition ratio of the components contained in the glass composition, the manufactured glass article 100 may have excellent strength, and may have flexibility and physical properties so as to be applied to a foldable display device.

In an embodiment, the glass composition forming the glass article 100 may include $SiO_2$, $Al_2O_3$, $Na_2O$, $Li_2O$, CaO or MgO, and $ZrO_2$.

$SiO_2$ may constitute the skeleton of glass, and may serve to increase chemical durability and reduce the occurrence of cracks when scratches (indentations) are formed on the glass surface. $SiO_2$ may be a network former oxide forming the network of glass, and the manufactured glass article 100 including or consisting of $SiO_2$ may have a reduced thermal expansion coefficient and improved mechanical strength.

$Al_2O_3$ serves to improve the breakage resistance of glass. That is, $Al_2O_3$ may serve to generate a smaller number of fragments when the glass is broken. $Al_2O_3$ may be an intermediate oxide forming a bond with $SiO_2$ forming a network structure. In addition, $Al_2O_3$ may serve as an active component that improves ion exchange performance during chemical strengthening and increases surface compressive stress after strengthening.

$Na_2O$ serves to form surface compressive stress by ion exchange and improve the meltability of glass. $Na_2O$ may form non-bridging oxygen in the $SiO_2$ network structure by forming an ionic bond with oxygen of $SiO_2$ forming the network structure. The increase in the non-bridging oxygen may improve the flexibility of the network structure, and the glass article 100 may have physical properties applicable to a foldable display device.

Similarly to the above-described $Na_2O$, $Li_2O$ serves to form surface compressive stress by ion exchange and improve the meltability of glass. $Li_2O$ may form non-bridging oxygen in the $SiO_2$ network structure by forming an ionic bond with oxygen of $SiO_2$ forming the network structure. The increase in the non-bridging oxygen may improve the flexibility and impact absorption function of the network structure, and the glass article 100 may have physical properties applicable to a foldable display device.

MgO may improve the surface strength of glass and reduce the formation temperature of glass. MgO may be a network modifier oxide modifying the $SiO_2$ network structure forming the network structure. MgO may reduce the refractive index of glass and adjust the thermal expansion coefficient and elastic modulus of glass. CaO may improve the surface strength of glass. CaO may be a network modifier oxide modifying the $SiO_2$ network structure forming the network structure. CaO may increase the glass transition temperature of glass and improve chemical durability.

$ZrO_2$ may improve the transmittance and surface strength of glass and increase resistance to surface crack propagation. $ZrO_2$ may be an intermediate oxide forming a bond with $SiO_2$ forming a network structure. $ZrO_2$ may be bonded to a part where bonds are broken by $Li_2O$ and $Na_2O$ in the $SiO_2$ network structure, thereby increasing the fracture toughness of glass and increasing the repulsive force against bending.

In addition to the components mentioned above, the glass composition may further include components such as $P_2O_5$, $B_2O_3$, $K_2O$, $SnO_2$, $Y_2O_3$, $La_2O_3$, $Nb_2O_5$, $Ta_2O_5$, $Gd_2O_3$, or the like as desired. In addition, a relatively small amount of $Sb_2O_3$, $CeO_2$, and/or $As_2O_3$ may be further included as a clarifying agent.

The glass article 100 manufactured by the glass composition in an embodiment may have characteristics and physical properties applicable to a foldable display device. In an embodiment, the glass article 100 may have flexibility so as to be folded and unfolded, and may have strength and chemical properties enough to be applied to a cover window of the display device 500, for example. Further, the glass composition may provide flexibility so that the glass article 100 may be folded and unfolded. The folding and unfolding characteristics of the glass article 100 may be improved by reducing the glass transition temperature and elastic modulus of glass. That is, as the elastic modulus of glass is reduced, the stress applied to the lower portion of the glass article during folding and unfolding is reduced, thereby improving the bending characteristics of the glass article.

The glass composition having the above composition may be molded into a plate glass shape by various methods known in the art. When it is molded into a plate glass shape, it may be further processed and manufactured into the glass article 100 applicable to the display device 500. However, the disclosure is not limited thereto, and the glass composition may not be molded into a plate glass shape and may be directly molded into the glass article 100 applicable to a product without an additional molding process.

Hereinafter, a process in which the glass composition is molded into a plate glass shape and the glass is processed into the glass article 100 will be described.

Figure 7:
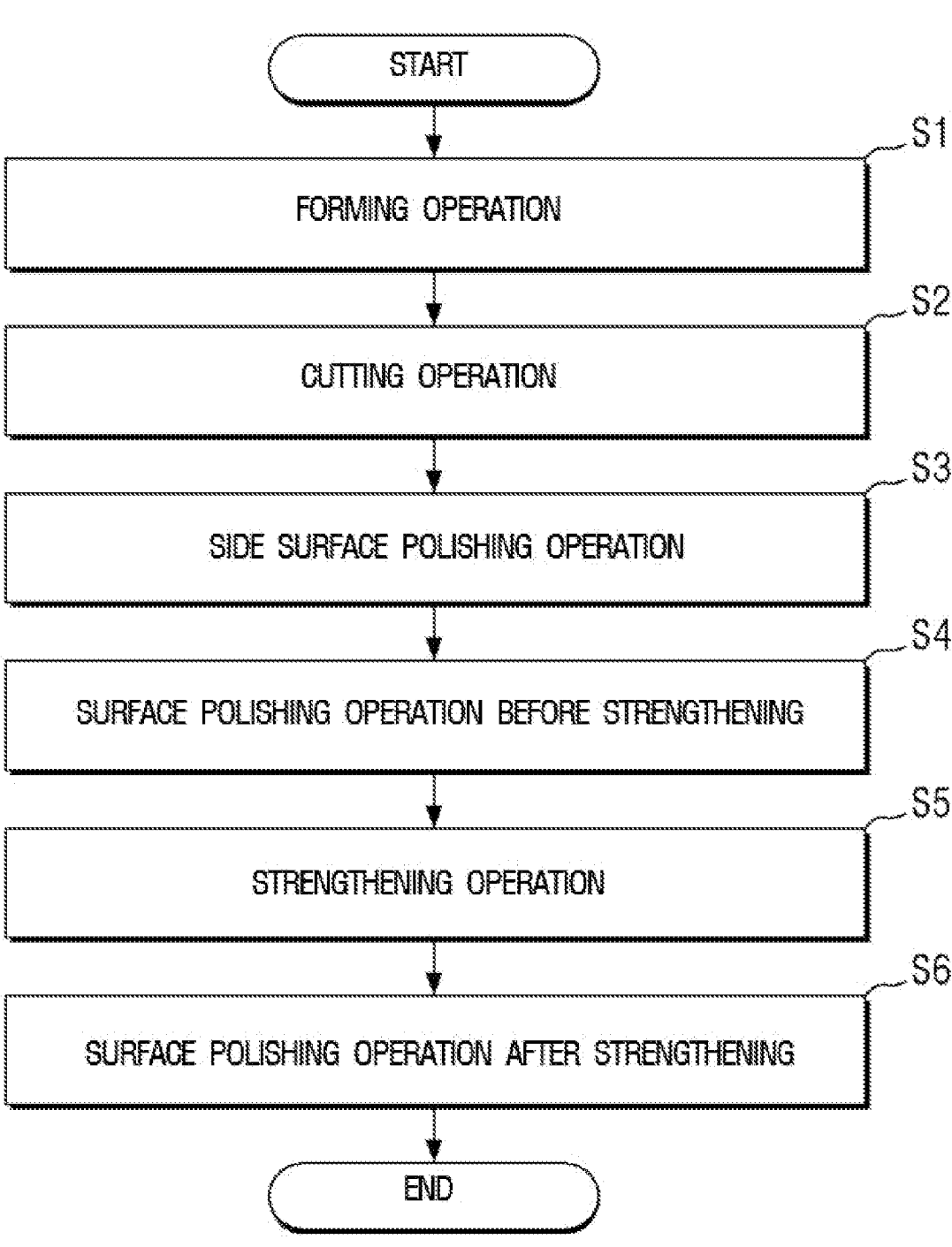
FIG. 7 is a flowchart showing an embodiment of the
operations of a process for fabricating a glass article.
Figure 8:
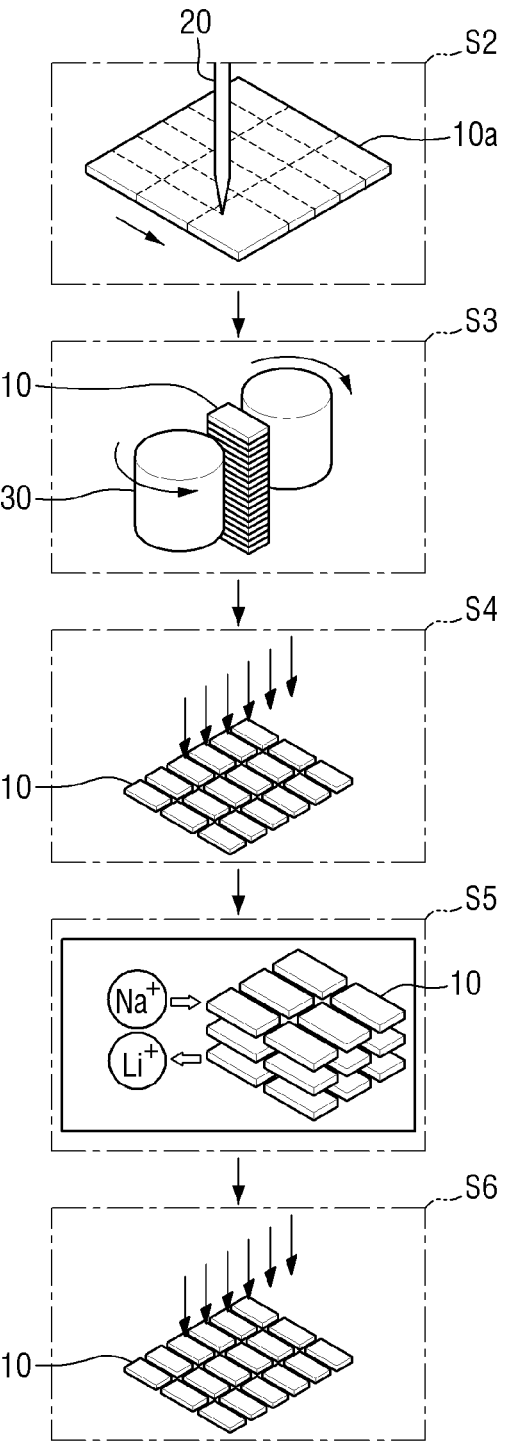
FIG. 8 is a diagram schematically showing the operations
of FIG. 7 from a cutting operation to a surface polishing
operation after strengthening.

FIG. 7 is a flowchart showing the operations of a process for fabricating a glass article. FIG. 8 is a diagram schematically showing the operations of FIG. 7 from a cutting operation to a surface polishing operation after strengthening.

Referring to FIGS. 7 and 8, the method for producing the glass article 100 may include a molding operation S1, a cutting operation S2, a side polishing operation S3, a surface polishing operation S4 before strengthening, and a strengthening operation S5, and a surface polishing operation S6 after strengthening.

The molding operation S1 may include preparing a glass composition and molding the glass composition. The glass composition may have the composition and components as described above. A detailed description thereof is omitted. The glass composition may be molded into a plate glass shape by a method such as a float process, a fusion draw process, a slot draw process, or the like.

The glass molded into a flat plate shape may be cut through the cutting operation S2. The glass molded into a flat plate shape may have a different size than that of the final glass article 100. In an embodiment, glass molding may be performed to form a large-area substrate as a parent substrate 10a including a plurality of glass articles, for example. The parent glass substrate 10a may be cut into a plurality of cells 10 to produce a plurality of glass articles. In an embodiment, even though the final glass article 100 has a size of about 6 inches, when glass is molded to have a size of several to several hundred times, e.g., about 120 inches and then cut, 20 glass articles molded into a flat plate shape may be obtained at once, for example. In this way, process efficiency may be improved as compared with a case of molding an individual glass article separately. In addition, even when molding the glass corresponding to the size of one glass article, when the final glass article has various planar shapes, it may be made into a desired shape through a cutting process.

Cutting of the glass 10a may be performed using a cutting knife 20, a cutting wheel, a laser, or the like.

The cutting operation S2 of glass may be performed before the strengthening operation S5 of glass. The parent glass substrate 10a may be strengthened at once and then cut into the size of the final glass article. However, in this case, the cut surface (e.g., side surface of glass) may be put in a non-strengthened state. Accordingly, it may be preferable to perform the strengthening operation S5 after cutting is completed.

Between the cutting operation S2 and the strengthening operation S5 of glass, a polishing operation before strengthening may be performed. The polishing operation may include the side polishing operation S3 and the surface polishing operation S4 before strengthening. In an embodiment, after the side polishing operation S3 is performed first, the surface polishing operation S4 before strengthening may be performed, but this order may be reversed.

The side polishing operation S3 is an operation of polishing the side surface of a cut glass 10. In the side polishing operation S3, the side surface of the glass 10 is polished to have a smooth surface. Further, each side surface of the glass 10 may have a uniform surface through the side polishing operation S3. More specifically, the cut glass 10 may include one or more cut surfaces. In some cut glasses 10, two side surfaces of four side surfaces may be cut surfaces. In some other cut glasses 10, three side surfaces of four side surfaces may be cut surfaces. In some other cut glasses 10, all of four side surfaces may be cut surfaces. When the side surface is a cut surface, it may have a different surface roughness from that of an uncut surface. In addition, even the cut surfaces may have different surface roughness. Therefore, by polishing each side surface through the side polishing operation S3, each side surface may have uniform surface roughness or the like. Further, when there is a relatively small crack on the side surface, it may be removed through the side polishing operation S3.

The side polishing operation S3 may be performed simultaneously on a plurality of cut glasses 10. That is, in a state where the plurality of cut glasses 10 are stacked, the stacked glasses 10 may be polished at the same time.

The side polishing operation S3 may be performed by a mechanical polishing method or a chemical mechanical polishing method using a polishing apparatus 30. In an embodiment, two opposite side surfaces of the cut glasses 10 may be polished simultaneously, and then the other two opposite side surfaces may be polished simultaneously, but the invention is not limited thereto.

The surface polishing operation S4 before strengthening may be performed to remove surface flaws by etching of each glass 10 and to have a uniform surface. In an embodiment, the surface polishing operation S4 before strengthening may be performed by an etching process.

After the surface polishing operation S4 before strengthening, the strengthening operation S5 is performed. The strengthening operation S5 may include chemical strengthening and/or thermal strengthening. In the case of the glass 10 having a thin thickness of about 2 mm or less, particularly, about 0.75 mm or less, a chemical strengthening method may be appropriately applied for precise stress profile control.

After the strengthening operation S5, selectively, the surface polishing operation S6 after the strengthening may be further performed. The surface polishing operation S6 after strengthening may remove fine cracks on the surface of the strengthened glass 10 and control compressive stress of the first surface and the second surface of the strengthened glass 10. In an embodiment, a floating method, which is one of methods for manufacturing a glass plate, is performed by flowing a glass composition into a tin bath, for example. In this case, the surface of the glass plate in contact with the tin bath may have different compositions from the surface not in contact with the tin bath. As a result, after the strengthening operation S5 of the glass 10, a deviation in compressive stress may occur between the surface in contact with the tin bath and the surface not in contact with the tin bath. However, by removing the surface of the glass 10 to an appropriate thickness by polishing, it is possible to reduce the deviation in compressive stress between the contact surface and the non-contact surface.

In an embodiment, the surface polishing operation S6 after strengthening may be performed by chemical etching polishing. The polishing thickness may be adjusted, e.g., in the range of about 100 nm to about 1000 nm, but is not limited thereto. The polishing thicknesses of the first surface and the second surface may be the same, but may be different.

Although not shown in the drawings, after the surface polishing operation S6 after strengthening, a shape machining process may be further performed as desired. In an embodiment, in the case of manufacturing the glass articles 101 to 103 having the three-dimensional shapes shown in FIG. 1, a three-dimensional machining process may be performed after completion of the surface polishing operation S6 after strengthening, for example.

As described above, the glass article 100 manufactured by the above process may be applied to the cover window of the display device 500 that is a foldable display device. The glass article 100 may have flexibility and foldable characteristics. Further, the glass article 100 may have impact resistance characteristics enough to be applied to a cover window.

The impact resistance characteristics of the glass article 100 may be related to various mechanical and chemical properties of the glass article 100. In an embodiment, the glass article 100 may have properties such as a thermal expansion coefficient, a transition temperature, a density, Young's modulus, Poisson's ratio, Vickers hardness, fracture toughness, brittleness, or the like, for example. The physical properties are measurable by a specimen of the glass article 100. In general, the glass article 100 may have excellent impact resistance characteristics when the values of the physical properties exceed a predetermined level, but the reference value thereof may be unclear. In an embodiment, in the case of comparing the physical properties of various glass articles 100, it may be difficult to predict that the glass article 100 whose predetermined physical properties have relatively high values necessarily has better resistance to external impacts than other glass articles 100, for example. It means that various physical properties of the glass article 100 need to be comprehensively evaluated to determine whether or not it has excellent impact resistance characteristics, so that it is impossible to evaluate the impact resistance properties of the glass article 100 simply by the measurable physical properties of the glass article 100. In particular, when the glass article 100 is applied to the cover window of the display device 500, the correlation between the impact resistance characteristics of the glass article 100 and the values of the physical properties of the glass article 100 may be unclear.

A pen drop test is utilized as one of the indicators for evaluating the impact resistance characteristics of the glass article 100. In the case of preparing various glass articles 100 as predetermined specimens and performing the pen drop test, the impact resistance characteristics of the glass article 100 may become more excellent as the height of the pen at which cracks or damages start to occur in the glass article specimens becomes higher. That is, the pen drop test result may be a clear criterion for evaluating the impact resistance characteristics of the glass article 100 rather than the values of the physical properties of the glass article 100.

Whether or not the glass article 100 is damaged may be affected by upper damage and lower damage in the area to which an impact is applied and structural changes of molecules constituting the glass article 100. When the glass article 100 has relatively high resistance to the upper damage and the lower damage, the glass articles 100 is likely to withstand external impacts. When there is a free space between molecules constituting the glass article 100, the molecular structure changes easily and the glass article 100 is likely to withstand external impacts.

In an embodiment, the glass article 100 may have factors that may be quantifiable and derived as measurable physical properties, and the quantified factors may have relatively high consistency with the pen drop test result that is the clear criterion for impact resistance characteristics. Therefore, the pen drop test result and the impact resistance characteristics of the glass article 100 may be predicted by the values of predetermined factors, and the impact resistance characteristics of the glass article 100 may be improved by improving the values of the corresponding factors. The glass article 100 may have excellent pen drop characteristics, that is, impact resistance characteristics, because predetermined factors to be described below have a predetermined value or more. Hereinafter, various factors that are highly consistent with the pen drop test result will be described as various factors that may be derived from the measurable physical properties of the glass article 100.

A first brittleness index, which is an index related to brittleness as a major factor of the resistance to the lower damage of the glass article 100 from external impacts, may be defined by the following Equation 1 (hereinafter also referred to as Eq. 1).

$$\text{First brittleness index} = 1/B = K_{IC}/H_v\left(\mu m^{0.5}\right) \qquad \text{[Eq. 1]}$$

In Eq. 1, 'B' is brittleness, '$K_{IC}$' is fracture toughness, and '$H_v$' is hardness. The unit of the first brittleness index of Eq. 1 may be '$\mu m^{0.5}$'. The 'B', '$K_{IC}$', and '$H_v$' may be substituted with values converted according to '$\mu m^{0.5}$' that is the unit of the first brittleness index.

In the glass article 100, the index related to brittleness or elastic energy related to resistance to lower bending breakage in the case of external impacts may be defined. The first brittleness index may have a higher value as the brittleness decreases, the fracture toughness increases, and the hardness decreases. The glass article 100 may have higher elastic energy as the first brittleness index increases, and may have excellent resistance to the lower bending breakage. In an embodiment, the first brittleness index of the glass article 100 that is defined by Eq. 1 may be $1.5*10^{-4}$ $\mu m^{0.5}$ or more.

In an embodiment, other factors of the glass article 100 that have relatively high consistency with the pen drop test result in relation to the first brittleness index may be further defined. The second brittleness index, the third brittleness index, and the fourth brittleness index of the glass article 100 may be defined by the following Equation 2 to Equation 4 (hereinafter also referred to as Eq. 2 to Eq. 4 respectively).

$$\text{Second brittleness index} = 1/B * K_{IC}(\text{MPa}*\text{m}) \qquad [\text{Eq. 2}]$$

$$\text{Third brittleness index} = 1/B * 1/T_g (\mu m^{0.5}/\text{K}) \qquad [\text{Eq. 3}]$$

$$\text{Fourth brittleness index} = 1/B * 1/T_g * E(\text{MPa}*\mu m^{0.5}/\text{K}) \qquad [\text{Eq. 4}]$$

In Eq. 2 to Eq. 4, 'B' is brittleness, '$K_{IC}$' is fracture toughness, '$T_g$' is a glass transition temperature, and 'E' is Young's modulus. The unit of the second brittleness index of Eq. 2 may be 'MPa*m', the unit of the third brittleness index may be '$\mu m^{0.5}$/K', and the unit of the fourth brittleness index may be 'MPa*$\mu m^{0.5}$/K'. The values converted according to the units of the second to fourth brittleness indices may be substituted for 'B', '$K_{IC}$', '$T_g$', and 'E', respectively. The second brittleness index, the third brittleness index, and the third brittleness index of Eq. 2 to Eq. 4 may be defined as indices further including correlation with the fracture toughness, the glass transition temperature, and the Young's modulus in the first brittleness index.

The free volume index of the glass article 100 may be defined as the factor related to the molecular vibration and the molecular structure of the glass article 100 in the case of external impacts. The free volume index, which is the factor related to the molecular structure of the glass article 100, may have a lower value as the glass transition temperature $T_g$ increases. When the glass article 100 has a lot of space between molecules due to its molecular structure, that is, when the free volume is large, the molecular structure change may be free against external impacts and the breakage resistance against external impacts may be excellent. However, this may have a trade-off relationship with a bonding strength and a degree of densification of glass in the glass article 100. In an embodiment, the glass article 100 may have the glass transition temperature $T_g$ of about 600° C. or lower, and the brittleness indices may satisfy predetermined numerical ranges.

Each of the second to fourth brittleness indices may further include factors in consideration of consistency with the pen drop test of the glass article 100. In an embodiment, in the glass article 100, the second brittleness index defined by Eq. 2 may be about $2.3*10^{-10}$ MPa*m or more, the third brittleness index defined by Eq. 3 may be about $2.0*10^{-7}$ $\mu m^{0.5}$/K or more, and the fourth brittleness index defined by Eq. 4 may be about $1.6*10^{-2}$ MPa*$\mu m^{0.5}$/K or more.

Eq. 1 to Eq. 4 described above may be indices related with the brittleness of the glass article 100. However, in the disclosure, the 'brittleness indices' of the glass article 100 may be indices defined by the above-described equations, and may not be equations that are completely equivalent to 'brittleness', 'fracture toughness', and 'glass transition temperature' commonly used in the technical field of the disclosure. The 'brittleness indices' defined in the above equations may be defined as partially corrected equations in consideration of consistency with the pen drop test that is one of the indicators of the impact resistance characteristics of the glass article 100.

The glass article 100 in an embodiment may have a thickness of 100 μm or less, e.g., 20 μm to 100 μm, or about 30 μm, and the brittleness indices of Eq. 1 to Eq. 4 may satisfy values within the above-described ranges.

The glass article 100 is thin and foldable, and thus a relatively high level of impact resistance characteristics is desired. As described above, each of the measurable physical properties of the glass article 100 may not be highly consistent with the pen drop test result and the impact resistance characteristics of the glass article 100. In other words, even when a predetermined physical property of the glass article 100 has a relatively high value, the glass article 100 may not necessarily have excellent impact resistance characteristics. However, in an embodiment, the factors defined by Eq. 1 to Eq. 4 including the measurable physical properties of the glass article 100 may have relatively high consistency with the pen drop test result. Accordingly, a degree of impact resistance characteristics of the glass article 100 may be measured by the quantified factors of the glass article 100.

Further, the glass article 100 in an embodiment may have characteristics applicable to the cover window of the foldable display device 500. The glass article 100 may have the above-described impact resistance characteristics and a thin thickness, and may satisfy transparency, content of foreign substances or cracks in a unit area, and light transmittance that are enough to be applied to the display device 500. The glass article 100 may have the impact resistance characteristics because the above-described brittleness indices satisfy predetermined values, and may have physical properties or characteristics desired for the cover window of the display device 500 so as to provide a clear screen to a user.

In an embodiment, the glass article 100 may have a stretch index $\beta_{KWW}$ within a range of about 0.95 to about 1.00. The glass article 100 may be suitable for the cover window of the foldable display device because it has excellent impact resistance characteristics while satisfying the above-described brittleness indices and has a relatively high stretch index. The 'stretch index' that is a physical property related to a strength factor, a Vogel temperature, and a glass transition temperature may indicate mobility and activity of atoms in the glass structure, and may verify the structural flow of the glass network structure. Since the glass article 100 has a relatively high stretch index, it may have excellent structural flow and flexible product characteristics.

Further, as described above, the glass article 100 may include various metal oxides (e.g., $Na_2O$, $Li_2O$, $CaO$ or $MgO$, and $ZrO_2$) in addition to $SiO_2$ and $Al_2O_3$. The physical properties of the glass article 100 may vary depending on a ratio between the content of the metal oxides included in the glass article 100, and the content of $Al_2O_3$. In an embodiment, in the glass article 100, the fluxes defined as a ratio ($R^1_2O/R^2O$) of the content of a monovalent metal oxide ($R^1_2O$, where 'R'' is a monovalent metal element) to the content of a divalent metal oxide ($R^2O$, where '$R^2$' is a divalent metal element) in the metal oxide may be within a range of 5 to 10, and R-Ratio defined as a ratio ($Al_2O_3/(R^1_2O+R^2O)$) of the content of $Al_2O_3$ to the total content ($R^1_2O+R^2O$) of the metal oxide may be within a range of 0.2 to 0.6. In the above formulas, '$R^1$' and '$R^2$' are monovalent or divalent metal elements, and embodiments of '$R^1_2O$' and '$R^2O$' that may be included in the glass article 100 may be $Na_2O$, $Li_2O$, $K_2O$, $CaO$, $MgO$, or the like. The glass article 100 has the above-described brittleness indices having predetermined values, a relatively high stretch index, and the fluxes and the R-Ratio having values within the above-described ranges, and thus may have excellent impact resistance characteristics and flexibility.

Hereinafter, the result of the pen drop test performed on various glass articles 100 and the consistency evaluation between the above-described factors will be described.

EXAMPLES

Preparation Example 1: Preparation of Glass Articles

A plurality of glass substrates having various compositions was prepared and divided into SAMPLE #1 to #21, then, a glass article preparation process was performed for each Sample by the above-described method. The glass article for each sample was prepared to have a thickness of 50 μm.

Samples of the glass articles were prepared by the following process.

The glass article was molded to a glass block by weighing 500 g of PtRh10% crucible for each sample, increasing a temperature to 1500° C. to 1650° C. at a rate of 10K/min, maintaining the temperature for 3 to 6 hours, and rapidly cooling it in a carbon mold of 600° C.

In order to remove the residual stress of the prepared glass block, annealing was performed at a temperature higher than the glass transition temperature checked for each sample by 30° C. for 1 to 6 hours, then, the glass block was cooled to 400° C. at a rate of 1 K/min and then cooled to room temperature, thereby obtaining a glass block having a thickness of 10 mm.

In order to perform the pen drop test of the prepared glass blocks, the glass blocks were cut into a thickness of 270 μm using diamond wire saw equipment, and then polished on opposite sides until the thickness became 50 μm.

The specimen processed into 50 μm for each sample was chemically strengthened using $KNO_3$ molten salt. The surface compressive stress (CS) was controlled to be within a range of 700 MPa to 800 MPa, and the depth of layer (DoL) was controlled to be within a range of 15% to 20% compared to the glass thickness.

In order to compare the factors defined by the above equations with the actual pen drop test result of the glass article 100, the structural flow of the glass article samples was checked by theoretical viscosity calculation, and the impact resistance major factor was checked by physical property analysis. First, the viscosity of glass was checked by the VFT equation, and the following Equation (1) (hereinafter also referred to as Eq. (1)) relates to the viscosity and temperature of glass.

$$\log \eta = A_{VFT} + \frac{B_{VFT}}{T - T_0} \qquad \text{[Eq. (1)]}$$

where n is viscosity, $A_{VFT}$ is relatively high temperature limit viscosity, $T_0$ is a Vogel temperature, and $B_{VFT}$ is viscosity at $T_0$.

In order to check the flow of the glass structure based on the Vogel temperature, the following Equation (2) (hereinafter also referred to as Eq. (2)) was derived based on the KWW formula.

$$\beta_{KWW} = 1 - \sqrt{\frac{(T_0 - T_g)^2}{D}} \qquad \text{[Eq. (2)]}$$

Here, $\beta_{KWW}$ is a stretch index, D is a strength factor $(=B_{VFT}/T_0)$, $T_0$ is a Vogel temperature, and $T_g$ is a glass transition temperature. The Vogel temperature $T_0$ indicates an ideal glass transition temperature $T_g$, and generally refers to the point where the free volume desired for relaxation of the glass network structure is theoretically zero without the influence of manufacturing conditions such as a cooling rate, a capacity, and defects of glass specimens. Therefore, the viscosity at which the glass network structure is formed may be compared by the Vogel temperature comparison. Further, the stretch index $\beta_{KWW}$ calculated by $T_0$ may indicate mobility and activity of atoms in the glass structure, and may verify the structural flow of the glass network structure.

Next, the physical properties of the glass article for each sample were measured and shown in the following Table 1 together with the Vogel temperature $T_0$ and the stretch index $\beta_{KWW}$. The measured physical properties of the glass article include a thermal expansion coefficient CTE, a glass transition temperature $T_g$, a density ρ, a Young's modulus E, a Poisson's ratio v, a hardness Hv, a fracture toughness $K_{IC}$, and a brittleness B.

Here, the glass transition temperature $T_g$ was checked by preparing 5 g for each glass sample utilizing differential thermal analysis ("DTA") equipment and increasing a temperature to the glass transition temperature range at a rate of 10 K/min. The thermal expansion coefficient of glass was checked by preparing a specimen with a size of $10\times10\times13$ $mm^3$ for each composition utilizing thermo mechanical analyzer ("TMA") equipment and increasing the temperature at a rate of 10 K/min to the glass transition temperature range.

The Poisson's ratio was checked by manufacturing a specimen with a size of $10\times20\times3$ $mm^3$ for each composition and checking the stress and strain of the specimen using an elastic modulus tester.

The hardness $H_v$ and the fracture toughness $K_{IC}$ were calculated by the following Equation (3) and Equation (4) (hereinafter also referred to as Eq. (3) and Eq. (4) respectively) by applying a load of 4.9 Newton (N) for 30 seconds with Vickers hardness tester equipment using a diamond tip with a size of 19 μm.

$$H_V = 1.854 \cdot \frac{F}{a^2} \qquad \text{[Eq. (3)]}$$

where, $H_V$ indicates Vickers hardness, F indicates a load, and a indicates an indentation length.

$$\frac{K_{IC} \cdot \phi}{H_V \cdot a^{\frac{1}{2}}} = 0.15 \cdot K \cdot \left(\frac{c}{a}\right)^{-\frac{3}{2}} \qquad \text{[Eq. (4)]}$$

where, $K_{IC}$ indicates fracture toughness, $\phi$ indicates a constraint index ($\phi \approx 3$), $H_V$ indicates Vickers hardness, K indicates a constant (=3.2), c indicates a crack length, and a indicates an indentation length.

Brittleness (B) was calculated by the following Equation (5) (hereinafter also referred to as Eq. (5)) by applying a load of 4.9 N for 30 seconds using Vickers hardness tester equipment.

$$B = \gamma P^{-1/4} \frac{C^{3/2}}{a} \qquad \text{[Eq. (5)]}$$

where B is brittleness, $\gamma$ is a constant ($2.39N^{1/4}/\mu m^{1/2}$), P is an indentation load, a is an indentation length, and C is a crack length.

The crack generation load was measured using Vickers hardness tester equipment.

disposed on a base substrate STA. After the glass article sample GP and the substrate SUB are bonded and cured for more than 30 minutes, the PDT was performed. The PDT was performed by dropping a pen PEN having a ball diameter of 0.7 mm and a weight of 1.12 g at a temperature

TABLE 1

| Sample group | CTE | $T_g$ | $\rho$ | E | v | $H_v$ | $K_{IC}$ | B |
|---|---|---|---|---|---|---|---|---|
| Unit | $10^{-7}$/K | K | g/cm$^3$ | MPa | — | MPa | MPa*m$^{0.5}$ | $\mu m^{-0.5}$ |
| SAMPLE#1 | 84 | 859.1 | 2.464 | 85000 | 0.213 | 6678.3 | 1.27 | 5.26 |
| SAMPLE#2 | 84 | 862.1 | 2.458 | 80000 | 0.202 | 6697.9 | 1.38 | 4.85 |
| SAMPLE#3 | 74 | 888.1 | 2.446 | 79000 | 0.202 | 6531.2 | 1.29 | 5.06 |
| SAMPLE#4 | 73.2 | 816.1 | 2.443 | 105000 | 0.348 | 5854.6 | 1.09 | 5.37 |
| SAMPLE#5 | 80 | 963.1 | 2.442 | 80000 | 0.202 | 6786.2 | 1.28 | 5.3 |
| SAMPLE#6 | 90 | 938.1 | 2.466 | 65000 | 0.242 | 5148.5 | 0.901 | 5.71 |
| SAMPLE#7 | 91 | 791.1 | 2.48 | 73000 | 0.23 | 5285.8 | 0.78 | 6.78 |
| SAMPLE#8 | 91.2 | 827.1 | 2.434 | 66000 | 0.197 | 4785.6 | 0.896 | 5.34 |
| SAMPLE#9 | 85.9 | 859.1 | 2.555 | 67000 | 0.242 | 5295.6 | 0.781 | 6.78 |
| SAMPLE#10 | 89 | 880.1 | 2.46 | 72000 | 0.22 | 5393.7 | 0.87 | 6.2 |
| SAMPLE#11 | 85.6 | 838.1 | 2.503 | 63000 | 0.237 | 5060.2 | 0.787 | 6.43 |
| SAMPLE#12 | 79.9 | 860.1 | 2.5 | 74000 | 0.13 | 5266.2 | 0.815 | 6.46 |
| SAMPLE#13 | 76 | 1003.1 | 2.444 | 78000 | 0.219 | 6501.8 | 1.29 | 5.04 |
| SAMPLE#14 | 77.1 | 959.1 | 2.63 | 64000 | 0.277 | 4658.2 | 0.914 | 5.1 |
| SAMPLE#15 | 82 | 860.1 | 2.473 | 82000 | 0.202 | 7011.8 | 1.02 | 6.87 |
| SAMPLE#16 | 84 | 1054.1 | 2.454 | 71000 | 0.197 | 5079.8 | 0.873 | 5.82 |
| SAMPLE#17 | 45 | 1040.1 | 2.555 | 86000 | 0.254 | 6492 | 1.082 | 6 |
| SAMPLE#18 | 35.2 | 1045.1 | 2.56 | 85000 | 0.243 | 7100 | 0.919 | 7.73 |
| SAMPLE#19 | 30.4 | 1028.1 | 2.512 | 92000 | 0.254 | 7433.4 | 1.067 | 6.97 |
| SAMPLE#20 | 85 | 932.1 | 2.428 | 66000 | 0.242 | 5060.2 | 0.772 | 6.55 |
| SAMPLE#21 | 61.9 | 952.1 | 2.458 | 72000 | 0.228 | 6648.9 | 0.928 | 7.16 |

In Table 1, 'CTE' is a thermal expansion coefficient, 'Tg' is a glass transition temperature, '$\rho$' is a density, 'E' is Young's modulus, 'v' is Poisson's ratio, 'Hv' is hardness, and 'KIC' is fracture toughness, and 'B' is brittleness.

Test Example 1: Impact Resistance Evaluation-Pen Drop (Pen Diameter 0.7 mm) Evaluation A pen drop test ("PDT") was performed as shown in FIG. 9 using the glass article samples prepared in Preparation Example 1.

Figure 9:
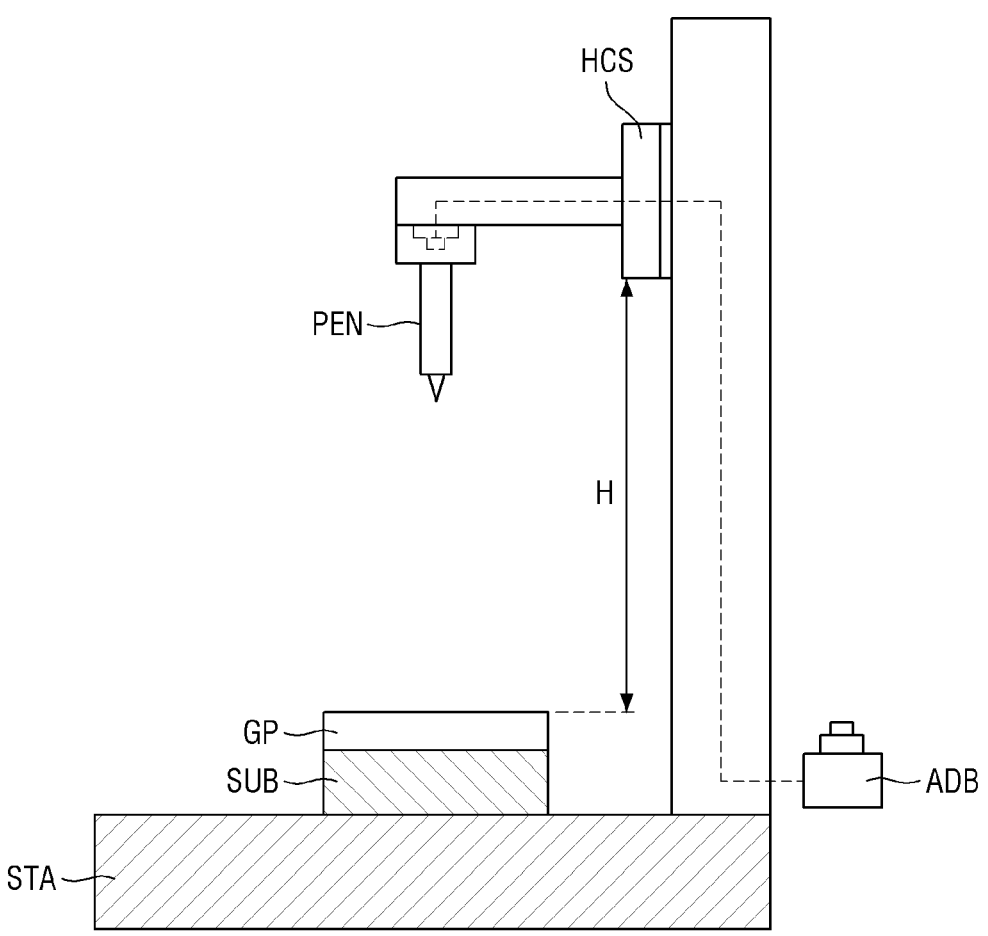
FIG. 9 is a diagram illustrating an embodiment of a pen
drop test method of a glass article.

FIG. 9 is a diagram illustrating an embodiment of a PDT method of a glass article.

Referring to FIG. 9, a glass article sample GP having a thickness of 50 μm was prepared while being bonded to a polyethylene film substrate SUB having a thickness of 250 μm and modularized. In an embodiment, the glass article sample GP and the polyethylene film substrate SUB may be of 20° C. to 22° C. and a humidity of 30% using an automatic dropping device ADB until breakage occurred in the glass article sample GP. A drop height H was increased at an interval of 0.5 cm using a drop height control device HCS, and the glass article sample GP was observed after one impact by a microscope to check whether cracks or breakage had occurred. The drop height H was defined as the vertical distance from the glass article sample GP to the drop height control device HCS.

The PDT was performed 30 times on three or more same glass article samples GP, and the average value was measured and shown in the following Table 2. Further, the physical properties measured in Preparation Example 1, the brittleness indices calculated by Eq. 1 to Eq. 4, and the stretch index were calculated and shown in the following Table 2.

TABLE 2

| Sample group | PDT (H) | Eq. 1 (1/B) | Eq. 2 (1/B*$K_{IC}$) | Eq. 3 (1/B* 1/$T_g$) | Eq. 4 (1/B* 1/$T_g$ * E) | Stretch index ($\beta_{KWW}$) |
|---|---|---|---|---|---|---|
| Unit | (cm) | $\mu m^{0.5}$ ($*10^{-4}$) | MPa*m ($*10^{-10}$) | ($\mu m^{0.5}$/K) ($*10^{-7}$) | MPa*$\mu m^{0.5}$/K ($*10^{-2}$) | — |
| SAMPLE#1 | 6.68 | 1.902 | 2.42 | 2.21 | 1.88153 | 0.993 |
| SAMPLE#2 | 6.57 | 2.06 | 2.84 | 2.39 | 1.91192 | 0.993 |
| SAMPLE#3 | 5.98 | 1.975 | 2.56 | 2.22 | 1.75695 | 0.949 |
| SAMPLE#4 | 5.92 | 1.862 | 2.03 | 2.28 | 2.3954 | 0.924 |
| SAMPLE#5 | 3.98 | 1.888 | 2.41 | 1.96 | 1.56676 | 0.937 |
| SAMPLE#6 | 3.96 | 1.75 | 1.58 | 1.87 | 1.21258 | −1.112 |
| SAMPLE#7 | 3.23 | 1.476 | 1.15 | 1.87 | 1.36168 | 0.965 |
| SAMPLE#8 | 3.15 | 1.872 | 1.68 | 2.26 | 1.49401 | 0.901 |
| SAMPLE#9 | 2.63 | 1.475 | 1.15 | 1.72 | 1.15018 | 0.877 |
| SAMPLE#10 | 2.5 | 1.613 | 1.4 | 1.83 | 1.31958 | 0.803 |
| SAMPLE#11 | 2.5 | 1.555 | 1.22 | 1.86 | 1.16909 | 0.889 |

TABLE 2-continued

| Sample group | PDT (H) (cm) | Eq. 1 (1/B) $\mu m^{0.5}$ $(*10^{-4})$ | Eq. 2 (1/B*$K_{IC}$) MPa*m $(*10^{-10})$ | Eq. 3 (1/B* 1/$T_g$) Unit $(\mu m^{0.5}/K)$ $(*10^{-7})$ | Eq. 4 (1/B* 1/$T_g$ * E) MPa*$\mu m^{0.5}$/K $(*10^{-2})$ | Stretch index ($\beta_{KWW}$) — |
|---|---|---|---|---|---|---|
| SAMPLE#12 | 2.17 | 1.548 | 1.26 | 1.8 | 1.33151 | 0.876 |
| SAMPLE#13 | 2.16 | 1.984 | 2.56 | 1.98 | 1.54279 | 0.959 |
| SAMPLE#14 | 2.02 | 1.962 | 1.79 | 2.05 | 1.30933 | — |
| SAMPLE#15 | 2.02 | 1.455 | 1.48 | 1.69 | 1.38688 | 0.929 |
| SAMPLE#16 | 2 | 1.719 | 1.5 | 1.63 | 1.15755 | — |
| SAMPLE#17 | 1.91 | 1.667 | 1.8 | 1.6 | 1.37807 | 0.925 |
| SAMPLE#18 | 1.5 | 1.294 | 1.19 | 1.24 | 1.05273 | 0.966 |
| SAMPLE#19 | 1.5 | 1.435 | 1.53 | 1.4 | 1.28448 | 0.876 |
| SAMPLE#20 | 1.2 | 1.528 | 1.18 | 1.64 | 1.08028 | 0.531 |
| SAMPLE#21 | 0.83 | 1.396 | 1.3 | 1.47 | 1.05547 | 0.801 |

In Table 2, the glass article samples were ranked in the order of excellent pen drop ("PDT") test results. In the PDT, SAMPLE #1 has excellent impact resistance characteristics because cracks were generated at the highest position, and SAMPLE #21 has poor impact resistance characteristics because cracks were generated at the lowest position.

Referring to Table 2, it is clear that the PDT results and the values of Eq. 1 to Eq. 4 show substantially the same tendency. It is clear that samples having relatively small brittleness indices of Eq. 1 to Eq. 4 substantially have poor PDT results. In particular, it is clear that the fourth brittleness index defined by Eq. 4 shows the highest consistency with the result values of the PDTs. When the above-described brittleness indices are small, it is possible to predict that the impact resistance characteristics are poor. On the contrary, it is clear that samples having relatively large brittleness indices of Eq. 1 to Eq. 4 show excellent PDT results. That is, when the above-described brittleness indices are large, it is possible to predict that the impact resistance characteristics are excellent.

Further, it is clear that, among the samples, SAMPLE #1 and SAMPLE #2 have stretch indices of 0.95 or more, or 0.990 or more. It is clear that SAMPLE #1 and SAMPLE #2 have excellent impact resistance characteristics from the PDT result, and have excellent flexibility from relatively high stretch indices. The glass article 100 in an embodiment may have excellent physical properties enough to be applied to a cover window of a foldable display device, as in the case of SAMPLE #1 and SAMPLE #2.

In concluding the detailed description, those skilled in the art will appreciate that many variations and modifications may be made to the preferred embodiments without substantially departing from the principles of the disclosure. Therefore, the disclosed preferred embodiments of the invention are used in a generic and descriptive sense only and not for purposes of limitation.

What is claimed is:

1. A glass article comprising:
a first surface; and
a second surface opposite to the first surface in a thickness direction,
wherein a thickness from the first surface to the second surface ranges from about 20 micrometers ($\mu m$) to about 100 $\mu m$,
a first brittleness index defined by following Equation 1 is about $1.5*10^{-4}$ $\mu m^{0.5}$ or more:

$$\text{First brittleness index} = 1/B = K_{IC}/H_v\left(\mu m^{0.5}\right) \qquad \text{[Equation 1]}$$

where 'B' is brittleness, '$K_{IC}$' is fracture toughness, and '$H_v$' is hardness, and
a stretch index defined by following Equation (2) is about 0.95 or more:

$$\beta_{KWW} = 1 - \sqrt{\frac{(T_0 - T_g)^2}{D}} \qquad \text{[Equation (2)]}$$

where 'D' is a strength factor (=$B_{VFT}/T_0$), '$T_0$' is a Vogel temperature, and '$T_g$' is a glass transition temperature.

2. The glass article of claim 1, wherein a second brittleness index defined by following Equation 2 is about $2.3*10^{-10}$ megapascal (MPa)*m (meter) or more:

$$\text{Second brittleness index} = 1/B * K_{IC} \ (\text{MPa} * \text{m}) \qquad \text{[Equation 2]}$$

where 'B' is brittleness, and '$K_{IC}$' is fracture toughness.

3. The glass article of claim 1, wherein a third brittleness index defined by following Equation 3 is about $2.0*10^{-7}$ $\mu m^{0.5}$/kelvin (K):

$$\text{Third brittleness index} = 1/B * 1/T_g \ \left(\mu m^{0.5}/K\right) \qquad \text{[Equation 3]}$$

where 'B' is brittleness, and '$T_g$' is the glass transition temperature.

4. The glass article of claim 1, wherein a fourth brittleness index defined by following Equation 4 is about $1.6*10^{-2}$ MPa*$\mu m^{0.5}$/K or more:

$$\text{Fourth brittleness index} = 1/B * 1/T_g * E \ \left(\text{MPa} * \mu m^{0.5}/K\right) \qquad \text{[Equation 4]}$$

where 'B' is brittleness, '$T_g$' is the glass transition temperature, and 'E' is Young's modulus.

5. The glass article of claim 1, wherein in a pen drop test performed with a pen having a ball diameter of about 0.7 millimeter (mm) and a weight of about 1.12 grams (g), a crack occurrence height is about 6 centimeters (cm) or more.

6. The glass article of claim 1, wherein the glass article has flexibility.

7. The glass article of claim 1, wherein the glass transition temperature is equal to or lower than about 600 degree Celsius (° C.).

8. The glass article of claim 1, wherein the glass article includes $SiO_2$, $Al_2O_3$, and metal oxide, fluxes defined as a ratio of a content of a monovalent metal oxide to a content of a divalent metal oxide in the metal oxide are within a range of about 5 to about 10, and a ratio of a content of $Al_2O_3$ to a total content of the metal oxide is within a range of about 0.2 to about 0.6.

9. A glass article for a cover window of a foldable display device, the glass article comprising:

a first surface; and a second surface opposite to the first surface in a thickness direction wherein a thickness from the first surface to the second surface ranges from about 20 micrometers (μm) to about 100 μm, a first brittleness index defined by following Equation 1 is about $1.5*10^{-4}$ $\mu m^{0.5}$ or more:

$$\text{First brittleness index} = 1/B = K_{IC}/H_v\left(\mu m^{0.5}\right) \qquad \text{[Equation 1]}$$

where 'B' is brittleness, '$K_{IC}$' is fracture toughness, and '$H_v$' is hardness, in a pen drop test performed with a pen having a ball diameter of about 0.7 millimeter (mm) and a weight of about 1.12 grams (g), a crack occurrence height is about 6 centimeters (cm) or more, and the glass article has flexibility.

10. The glass article of claim 9, wherein a second brittleness index defined by following Equation 2 is about $2.3*10^{-10}$ megapascal (MPa)*meter (m) or more:

$$\text{Second brittleness index} = 1/B * K_{IC} \ (MPa * m) \qquad \text{[Equation 2]}$$

where 'B' is brittleness, and '$K_{IC}$' is fracture toughness.

11. The glass article of claim 9, wherein a third brittleness index defined by following Equation 3 is about $2.0*10^{-7}$ $\mu m^{0.5}$/kelvin (K):

$$\text{Third brittleness index} = 1/B * 1/T_g \ \left(\mu m^{0.5}/K\right) \qquad \text{[Equation 3]}$$

where 'B' is brittleness, and '$T_g$' is a glass transition temperature.

12. The glass article of claim 9, wherein a fourth brittleness index defined by following Equation 4 is about $1.6*10^{-2}$ MPa*$\mu m^{0.5}$/K or more:

$$\text{Fourth brittleness index} = 1/B * 1/T_g * E \ (MPa * \mu m^{0.5}/K) \qquad \text{[Equation 4]}$$

where 'B' is brittleness, '$T_g$' is a glass transition temperature, and 'E' is Young's modulus.

13. The glass article of claim 9, wherein a stretch index defined by following Equation (2) is about 0.95 or more:

$$\beta_{KWW} = 1 - \sqrt{\frac{(T_0 - T_g)^2}{D}} \qquad \text{[Equation (2)]}$$

where 'D' is a strength factor ($=B_{VFT}/T_0$), '$T_0$' is a Vogel temperature, and '$T_g$' is a glass transition temperature.

14. The glass article of claim 9, wherein a glass transition temperature is equal to or lower than about 600 degree Celsius (° C.).

15. The glass article of claim 9, wherein the glass article includes $SiO_2$, $Al_2O_3$, and metal oxide, fluxes defined as a ratio of a content of a monovalent metal oxide to a content of a divalent metal oxide in the metal oxide are within a range of 5 to 10, and a ratio of a content of $Al_2O_3$ to a total content of the metal oxide is within a range of about 0.2 to about 0.6.

16. A display device comprising:

a display panel comprising a plurality of pixels;

a cover window disposed above the display panel, the cover window comprising:

a glass article which:

has a thickness ranges from about 20 micrometers (μm) to about 100 μm;

has a first brittleness index defined by following Equation 1 is about $1.5*10^{-4}$ $\mu m^{0.5}$ or more:

$$\text{First brittleness index} = 1/B = K_{IC}/H_v\left(\mu m^{0.5}\right) \qquad \text{[Equation 1]}$$

where 'B' is brittleness, '$K_{IC}$' is fracture toughness, and '$H_v$' is hardness; and has a stretch index defined by following Equation (2) is about 0.95 or more:

$$\beta_{KWW} = 1 - \sqrt{\frac{(T_0 - T_g)^2}{D}} \qquad \text{[Equation (2)]}$$

where 'D' is a strength factor ($=B_{VFT}/T_0$), '$T_0$' is a Vogel temperature, and '$T_g$' is a glass transition temperature; and an optically transparent bonding layer disposed between the display panel and the cover window.

17. The display device of claim 16, wherein a second brittleness index defined by following Equation 2 is about $2.3*10^{-10}$ MPa*m or more:

$$\text{Second brittleness index} = 1/B * K_{IC} \ (MPa * m) \qquad \text{[Equation 2]}$$

where 'B' is brittleness, and '$K_{IC}$' is fracture toughness, a third brittleness index defined by following Equation 3 is about $2.0*10^{-7}$ $\mu m^{0.5}$/K:

$$\text{Third brittleness index} = 1/B * 1/T_g \ \left(\mu m^{0.5}/K\right) \qquad \text{[Equation 3]}$$

where 'B' is brittleness, and '$T_g$' is the glass transition temperature, and a fourth brittleness index defined by following Equation 4 is about $1.6*10^{-2}$ MPa*$\mu m^{0.5}$/K or more:

$$\text{Fourth brittleness index} = 1/B * 1/T_g * E \ \left(\text{MPa} * \mu\text{m}^{0.5}/\text{K}\right) \quad \text{[Equation 4]}$$

where 'B' is brittleness, '$T_g$' is the glass transition temperature, and 'E' is Young's modulus.

18. The display device of claim 16, wherein the glass
article includes $SiO_2$, $Al_2O_3$, and metal oxide, fluxes defined as a ratio of a content of a monovalent
metal oxide to a content of a divalent metal oxide in the
metal oxide are within a range of about 5 to about 10,
and a ratio of a content of $Al_2O_3$ to a total content of the metal
oxide is within a range of about 0.2 to about 0.6.

19. The display device of claim 16, wherein in a pen drop
test performed with a pen having a ball diameter of about 0.7
millimeter (mm) and a weight of about 1.12 gram (g), a
crack occurrence height is about 6 cm or more.

20. The display device of claim 16, wherein the glass
transition temperature is equal to or lower than about 600°
C.

\* \* \* \* \*